United States Patent [15] 3,640,811

Vossen, Jr. [45] Feb. 8, 1972

[54] METHOD OF METALIZING SEMICONDUCTOR DEVICES

[72] Inventor: John Louis Vossen, Jr., Bedminster, N.J.

[73] Assignee: RCA Corporation

[22] Filed: Nov. 3, 1969

[21] Appl. No.: 873,299

[52] U.S. Cl. ....................204/192
[51] Int. Cl. ....................C23c 15/00
[58] Field of Search ....................204/192, 298

[56] References Cited

UNITED STATES PATENTS

| | | | |
|---|---|---|---|
| 3,479,269 | 11/1969 | Byrnes et al. | 204/192 |
| 3,121,852 | 2/1964 | Boyd et al. | 204/192 |
| 3,492,215 | 1/1970 | Conant | 204/192 |
| 3,324,019 | 6/1967 | Laegreid et al. | 204/192 |
| 3,233,137 | 2/1966 | Anderson et al | 204/298 |
| 3,325,393 | 5/1964 | Darrow et al. | 204/192 |
| 3,271,286 | 2/1964 | Lepselter | 204/192 |

OTHER PUBLICATIONS

Vassen et al., "Bach Scattering of Material Emitted from RF-Sputtering Targets," RCA Review, June 1970, Vol. 31, No. 2 pp. 293-305

*Primary Examiner*—John H. Mack
*Assistant Examiner*—Sidney S. Kanter
*Attorney*—Glenn H. Bruestle

[57] ABSTRACT

A semiconductor device is placed in a vacuum system and is sputter-etched by a radiofrequency glow discharge for a period of time sufficient to remove impurities and residual oxide layers from the contact surfaces of the device. A quantity of metal is then evaporated onto the purified surface while maintaining the glow discharge so that the metal is partially ionized and accelerated towards the purified surface, and thereby forms a solid solution with the semiconductor to provide a direct ohmic contact therewith without having to subsequently sinter the metal deposit.

3 Claims, 7 Drawing Figures

INVENTOR.
John L. Vossen, Jr.
BY [signature]
ATTORNEY

INVENTOR.
John L. Vossen, Jr.
BY
[signature]
ATTORNEY

METHOD OF METALIZING SEMICONDUCTOR DEVICES

BACKGROUND OF THE INVENTION

This invention relates to the metallization of semiconductor devices. More particularly, the invention relates to a method of forming direct ohmic contacts to a semiconductor without sintering a metal after it is deposited; and it has particular utility in large scale integrated circuits which require multilevel metallization schemes.

Certain characteristics are necessary for the proper metallization of the semiconductor device when ohmic contacts are to be formed. First, the metal must be a good electrical conductor. Further, it must make a low-resistance ohmic contact with the semiconductor material. Also, the metal film must be deposited adherently and uniformly over the surface contours of the device. Where the device includes a silicon dioxide passivation layer with openings therein for diffusing impurities and for making contact to the semiconductor body, the metal must deposit uniformly over the steep edges of these openings. Additionally, the metal deposit must be stable with time and maintain the characteristics cited above under a variety of electrical and environmental conditions.

Heretofore, in order to obtain an ohmic contact between metal and semiconductor, the metal deposit had to be sintered. Silicon semiconductor devices inherently had a thin layer of silicon dioxide remaining at the bottom of the semiconductor contact openings, and it was necessary to heat the devices to a fairly high temperature to allow the metal to penetrate through the oxide and form a solid solution with the semiconductor below. In particular, most semiconductor devices have been metallized by evaporating an aluminum film onto the device surface, and then sintering at a temperature between 250° and 550° C. to form the necessary ohmic contact between the metal and the semiconductor.

The heating of the devices has been harmful to the metal; and it has been especially harmful to metals, such as aluminum, which recrystalize at low temperatures. In these devices, the aluminum is completely recrystalized because aluminum begins to recrystalize at 150° C. which is substantially lower than the sintering temperature. Sintering at temperatures above the recrystalization temperature of the metal has a number of very harmful effects. First, the grain size of the crystallites that make up the film significantly increases. Initially, the grain size can be as small as 200 A. and usually is in order of 500 A.; however, after the heat treatment, the grain size averages about 30,000 A. and can be as large as 50,000 A. The increase grain size significantly reduces the quality of the deposited metal. Since the contact openings and surface irregularities on a typical semiconductor device range from about 3,000 to 15,000 A., the large grain size results in cracking and the development of voids near such openings and edges. This, in turn, gives rise to open circuits in these regions. This situation is aggravated by the necessity to subsequently define patterns in the metal by well-known photoresist and etching techniques. The photoresist protection for large grains cantilevered over steep edges is poor, so the chemical etchants seep under the photoresist and further erode the aluminum from the steep edges.

Second, the resistivity of the metal increases significantly when it is exposed to an oxidizing environment. The grain boundaries of the aluminum film oxidize easily. Also, the large grains are poorly ordered. Hence the resistivity of the films can be a factor of three to eight times greater than the bulk resistivity of pore aluminum.

Third, the recrystalization of the metal results in the growth of hillocks, grain edges popping up off the surface, and similar morphological projections from the device surface. Recrystalization involves mass transport of the metal which causes the volume of the metal to expand: thus, stress relief from the expansion is accomplished by the growth of projections away from the device surface. For a typical layer of aluminum film of about 15,000 A. in thickness, the recrystalization results in hillocks of 30,000 to 50,000 A. above the surface.

The hillocks and other surface projections particularly make multilevel metallization extremely difficult. It is nearly impossible to deposit a suitable insulating layer on the first metal layer of sufficient thickness to coat over the projections. A typical insulating layer has a thickness of about 1.5 micrometers; while the hillocks have a height of 3 to 5 micrometers. In order to cover these hillocks, the insulating layer would have to be so thick as to make it very difficult to subsequently define patterns in the insulating layer, even if such a thick layer could be deposited without crazing. Additionally, even if such as insulating layer could be applied, the projections are high electrical field points which would eventually break down the insulating material when subjected to electrical stress.

Also, multilevel aluminum metallization is further hindered because the first layer of metal always has a thin skin of thermally grown aluminum oxide on its surface. This requires that the subsequent metal layer must also be sintered to provide ohmic contacts between the metal layers. Thus, the subsequent sintering step further recrystalizes the metal and aggravates the deleterious effects described above.

SUMMARY OF THE INVENTION

In the present invention, the surface of the semiconductor device is sputter-etched by a radiofrequency glow discharge to remove impurities from the surface of the device. While maintaining the glow discharge, a metal film is then evaporated onto the purified surface so that the metal forms a solid solution with the semiconductor to provide a direct ohmic contact therewith.

DESCRIPTION OF THE PREFERRED EMBODIMENTS

Figure 1:
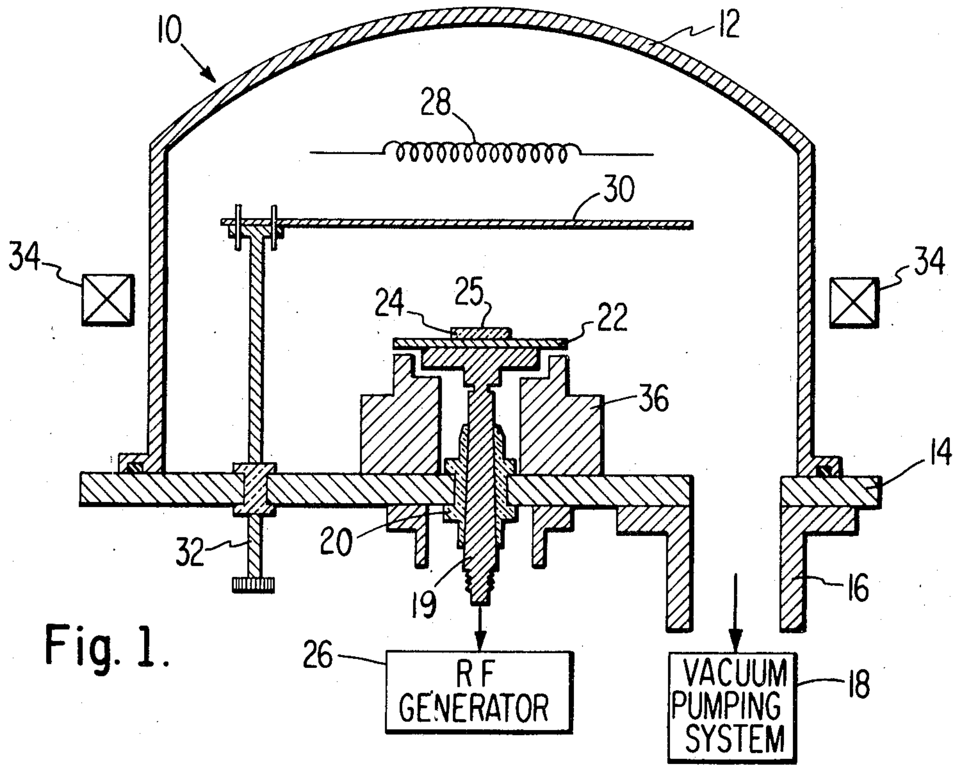
FIG. 1 is a cross-sectional view which illustrates the apparatus used in the present invention.

FIG. 1 is a cross-sectional view of typical apparatus which may be used in the metallization method of the present invention. The metallization is performed in a vacuum system 10 which includes a bell jar 12 mounted on a baseplate 14. The bell jar 12 is evacuated by means of a flanged opening 16 in the baseplate 14 which is connected to a vacuum pumping system 18. A radiofrequency feed thru 19 is inserted into the vacuum system 10 through the baseplate 14. The feed thru 19 is held in place by a glazed steatite insulator 20 which makes a vacuumtight fit with the baseplate 14. The feed thru 19 is an irregularly shaped metal stud having an enlarged upper end upon which a target backing plate 22 is mounted in electrical contact therewith. The backing plate 22 can be made of a wide variety of materials depending upon the metallization requirements to be discussed below; however, it is generally made of a refractory noble metal. A semiconductor device 24 having an exposed surface 25 is mounted at the center of the backing plate 22. The feed thru 19 is electrically connected to a radiofrequency generator 26. Within the bell jar 12 there is also an evaporation filament 28 which is suspended above the target backing plate 22 by means of a pair of electrical clamps (not shown in the drawing). A shutter 30 is attached to a push-pull rotary support 32 so that the shutter 30 may be interposed between the filament 28 and the target 22. A magnetic field coil 34 may be placed around the bell jar 12 to aid in ionizing the evaporated metal and/or to increase the RF glow discharge ion density. A grounded shield 36 is placed around the feed thru 19 and the backing plate 22 to prevent the glow discharge from occurring in these areas.

EXAMPLE I

The bare filament 28 is first heated in a vacuum to remove surface contamination. The filament 28 is then wound with a fixed length of wire (not shown in FIG. 1) made of whatever metal or material is selected for the metallization. In most semiconductor devices, aluminum metallization is selected and the wire is made of aluminum or some alloy thereof, such as 98 percent aluminum and 2 percent silicon. The filament 28 is then mounted inside the bell jar 12 by a pair of electrical clamps (not shown in FIG. 1). More than one filament can be used. The filament or filaments need not be positioned vertically above the substrates (as shown in FIG. 1); but may be disposed in any convenient way such as in a circular array about the edges of the target 22.

Figure 2:
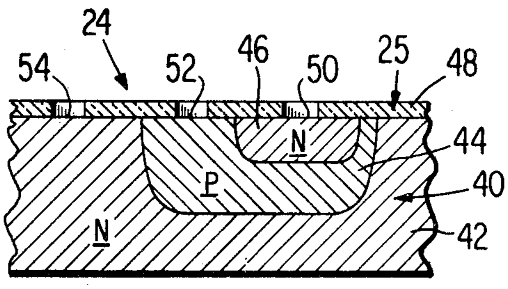
FIGS. 2–4 are views of a part of a typical semiconductor device in various stages of fabrication in accordance with the method of the present invention.
Figure 3:
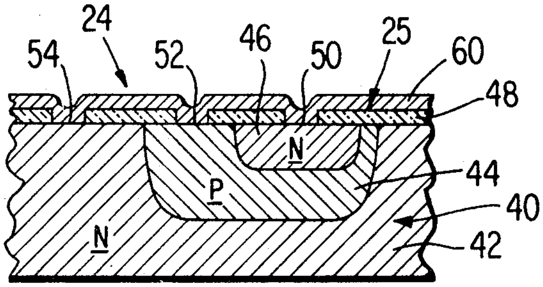
Figure 4:
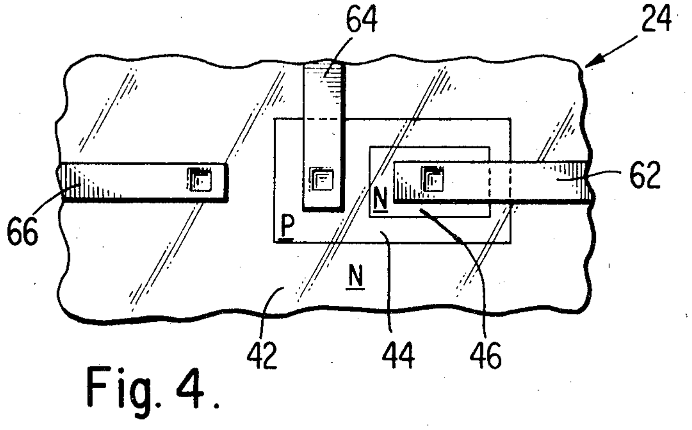

FIGS. 2–4 are schematic views of a part of a typical semiconductor device 24 in various stages of its fabrication. FIG. 2 is a cross-sectional view of the device 24 before it is metallized. The device 24 includes an NPN-transistor 40 having semiconductor regions 42, 44 and 46, and a silicon dioxide layer 48 on the surface 25 thereof. The oxide layer 48 has been selectively etched to provide contact openings 50, 52 and 54 to the regions 42, 44 and 46 of the transistor 40.

First, the semiconductor device 24 of FIG. 2 is cleaned and placed on the backing plate 22. Typically the semiconductor device 24 is ultrasonically cleaned in methyl alcohol, spun dry and then placed on the backing plate 22.

The vacuum system 10 is then evacuated by means of the vacuum pumping system 18. Preferably, the system 10 is pumped out to a pressure less than $5\times10^{-6}$ torr to obtain a sufficiently purified atmosphere for the subsequent metallization. The shutter 30 is then closed to isolate the device 24 from the filament 28. The filament 28 is then heated to melt the wire (not shown) onto the filament 28. To insure the cleanliness of the subsequent evaporation, the wire is melted on the filament 28 at a temperature higher than that to be used during the evaporation. The filament 28 is shut off as soon as the wire is sufficiently melted onto the filament 28.

A partial pressure of a sputtering gas is then admitted to the vacuum system 10. Preferably, an inert gas should be used; and in particular, argon gas may be used. The pressure of the gas should be such that it is capable of providing a glow discharge. Generally, the pressure may range between 0.5 and 50 millitorr; and in particular, a pressure of about 2.5 millitorr has been found to provide the optimum results.

Next, a radiofrequency glow discharge is established with the surface 25 of the device 24 being the target of the glow discharge so that the surface 25 is sputter-etched by the glow discharge to remove impurities therefrom. The glow discharge is established by connecting the device 24 to the radiofrequency generator 26 to provide a negative potential on the surface 25 of the device 24 for more than half of the cycle of the generator 26. The average value of the negative potential applied to the surface 25 is referred to as the glow discharge bias. The glow discharge is formed by the ionization of the sputtering gas, whereby the positively charge ions are accelerated towards the surface 25 of the semiconductor device 24 as long as it is negatively charged. Thus, the longer the device surface 25 remains negative, the longer the surface 25 is ion-bombarded by the glow discharge. The optimum results are obtained by capacitively coupling the surface 25 of the device 24 in series with the generator 26 to obtain the maximum duration of the negative potential on the device surface 25. There are a number of ways to capacitively couple the generator 26 to the surface 25 depending upon the type of device 24 and the backing plate 22. In the present example, a capacitor (not shown) is placed in series with the generator 26 and the feed thru 19, and the backing plate 22 is made of metal. The value of the capacitor is not particularly critical. The capacitor is customarily used also to match the impedance of the generator 26 to the electrical load presented by the target assembly and the glow discharge. In the present example, the capacitor has a value of about 500 picofarads. Alternatively, the backing plate 22 could be an insulator such as silicon dioxide, and a separate capacitor would not be needed; however, such a backing plate is not as desirable for reasons to be discussed below.

As the ions bombard the surface 25, they sputter-etch the surface 25 and remove impurities therefrom. Generally, these impurities include organic contamination, such as grease, dust and finger prints; and in particular includes the residual oxide layers which remain in the semiconductor contact openings 50, 52 and 54. The glow discharge is maintained for a period of time sufficient to remove the impurities and residual oxide layers so that the surface 25 is purified and the contact openings 52, 54 and 56 are free of any residual oxides. In the present example, the sputter-etching is maintained for a period of 5 to 10 minutes depending upon the particular characteristics of the device 24. The time is not particularly critical, because additional sputter-etching will just continue to purify and slowly remove the surface 25.

The filament 28 is then reheated and a quantity of metal is evaporated onto the device surface 25 while maintaining the glow discharge. As shown in FIG. 3, the evaporated metal forms a metal film 60 on the surface 25 of the device 24. A portion of the evaporated metal is ionized by the glow discharge forming positively charged metal ions, and these metal ions are also accelerated towards the device surface 25. Consequently, a percentage of the metal strikes the device surface 25 with an energy proportional to the negative bias potential on the device surface 25 as determined by the RF-generator 26. Thus, a percentage of the metal strikes the surface 25 with sufficient energy to penetrate the surface 25 to a few tens of angstroms.

By maintaining the glow discharge throughout the evaporation process, the semiconductor contact openings 50, 52 and 54 remain free of the residual thermal oxides which are otherwise inherently present, thereby allowing the metal to penetrate the semiconductor and form a solid solution with the semiconductor to provide direct ohmic contact therewith.

The sputter-etching also provides an additional benefit of scrubbing the device surface 25 during the critical deposition stages of nucleation and initial growth of the metal film; therefore, loosely bonded material arriving at the device surface 25 is desputtered to provide a film having a high adhesion and low-pinhole density. This "ion scrubbing" continues for the duration of film growth with the same benefits accruing.

The filament 28 is preadjusted to the proper temperature (filament current) for a period of time necessary to allow a film 60 of the proper thickness to be deposited upon the device surface 25 below. After the desired thickness of the metal has been deposited, the shutter 30 is closed and the filament 28 is shut off. The glow discharge is maintained until after the evaporation is finished so that the device surface 25 continues to be purified until after the metallization process has been completed.

The deposited metal film 60 on the surface 25 is then selectively etched to provide the metal leads 62, 64 and 66 as shown in FIG. 4. The etching may be performed by photoresist techniques well known in the art. In the present example, a photoresist is deposited upon the metal 60 and is selectively removed to expose portions of the metal 60. The surface of the metal 60 is significantly smoother and finer grained than that of metals deposited by the prior art methods and consequently, the photoresist can be deposited and selectively removed with much greater coating protection and accuracy. In particular, the photoresist coats well over the contact openings and steep edges in the surface contour. A chemical etchant is then applied to the surface 25 to remove the exposed metal 60 not covered by the photoresist. As a result of the increased accuracy and coating protection of the photoresist, the etchant does not seep under the photoresist and into the contact openings, and thus does not cause open circuits and poor electrical interconnections.

Figure 5:
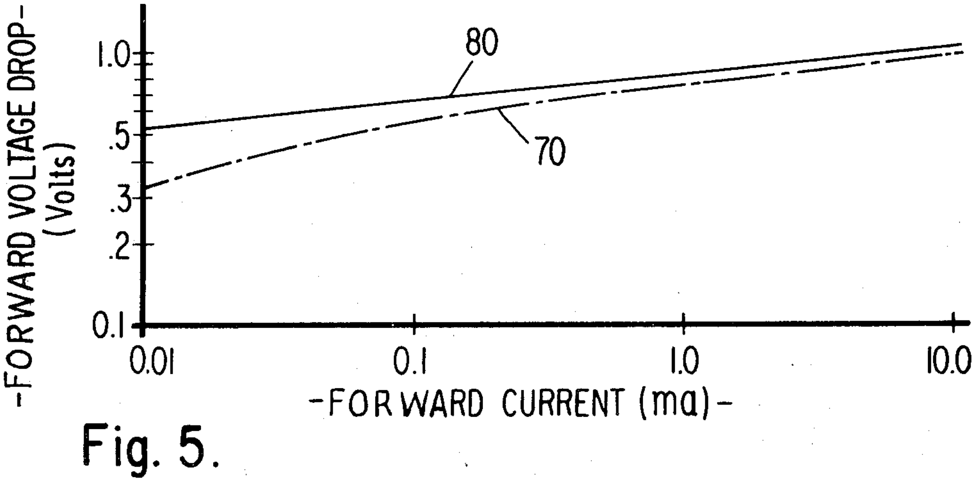
FIG. 5 is a graph which compares the contact resistance as a function of current for the present and prior art metallizations.

The metal layers of the present invention have been found to form highly adherent films which make low resistance, direct ohmic contacts to the semiconductor material below. FIG. 5 is a graph which compares the contact resistance as a function of current for the aluminum contacts of the present invention 70 and of similar aluminum contacts 80 formed by thermal evaporation and sintering. In particular, the graph plots the forward voltage drop of the base-emitter junction of the transistor 40. As shown in FIG. 5, the aluminum contacts of the present invention 70 are at least as good as the sintered contacts 80 of the prior art at high currents, and they are significantly better than the prior art sintered contacts 80 at low currents. It is suggested that the absence of the residual oxide layers not only allows the direct formation of a solid solution and ohmic contact with the semiconductor material, but also reduces the resistivity of the contact since there are no oxygen atoms intermingled in the solid solution at the metal-semiconductor interface. And, as mentioned before, the contacts of the present invention also avoid all of the unreliability problems resulting from the recrystallization of the metal as it is sintered to the semiconductor material below.

Figure 6:
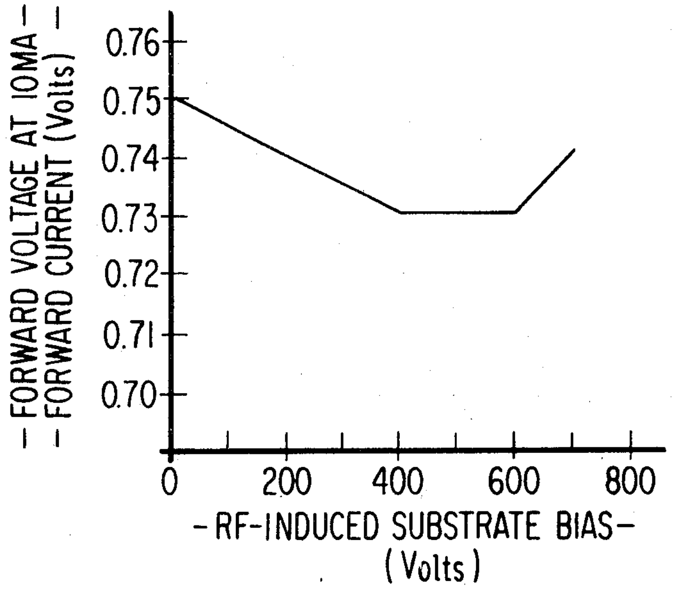
FIG. 6 is a graph which illustrates the forward voltage drop for an aluminum contact of the present invention as a function of the glow discharge bias applied to the device surface.

FIG. 6 is a graph which illustrates the ohmic resistance for another set of aluminum contacts of the present invention as a function of the glow discharge bias applied to the device surface 25. For a forward current of 10 milliamps, the forward voltage drop for a large area contact opening ranged from 0.75 to 0.73 volts drop; and the optimum results were obtained between 400 and 600 volts, where the forward voltage drop was 0.73 volts. The range of glow discharge bias that results in an optimum ohmic contact depends upon the contact geometry, RF-target geometry, and certain conditions prevailing in the low discharge, such as magnetic field applied (if any) and the discharge gas pressure.

The glow discharge bias has a significant effect on the surface morphology of the metallization. As mentioned above, the glow discharge bias causes a percentage of the evaporated metal to be accelerated and embedded in the surface 25 to a few tens of angstroms. The resulting films are fine grained, smooth and highly adherent; however at low-bias levels, there is evidence of incipient hillock formation and some microscopic pitting. As the bias level is increased, the implantation increases and the defects become less evident. The smoothest films have been deposited at –400 volts bias; and above that voltage, the surface begins to roughen again as grain growth sets in.

Figure 7:
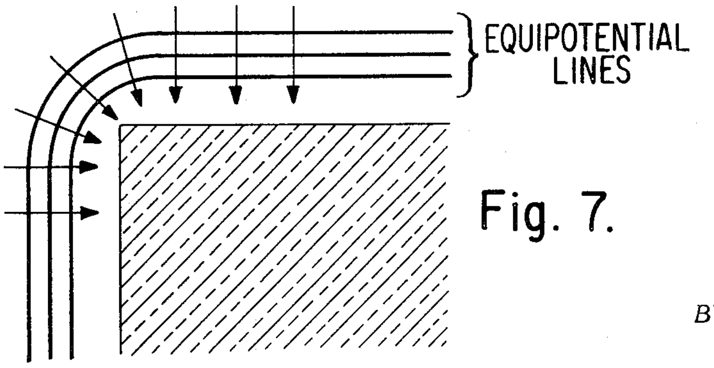
FIG. 7 is a diagram which schematically illustrates the electrical field around a steep edge on the surface of a semiconductor device.

The metallization coats over steep edges in the surface contour as well as the flat areas. As shown in FIG. 7, the edge of a steep surface contour represents a high-field point in the glow discharge and the bending of the equipotential lines at this edge results in a higher current density discharge in this region than on the plane surface of the device. On the one hand, the higher current density at the edge implies more sputter-etching and a thinner metal film; however on the other hand, the aluminum ion current density is also increased, thus depositing a thicker film to counteract the effect of the sputter-etching. Furthermore, the aluminum ions are accelerated towards the edge leading to an implantation of the aluminum and resulting in a highly adherent and pinhole free metal film. Furthermore, some of the metal arriving on the flat surfaces in a loosely bonded condition is desputtered at a small angle and is redeposited on the vertical walls. The gas pressure should be sufficient to create a good glow discharge, but it should not be so great as to cause gas bubble trapping in the metallization thereby causing poor adhesion and pinholes resulting from the collapse of gas bubbles in the metal film. In comparison, prior art metallizations which have not been radiofrequency sputter-etched during deposition of the metallization have had very poor coating over steep edges, and the subsequent sintering and recrystallization of these films has further eroded the coating over steep edges.

EXAMPLE II

This example is substantially the same as Example I with the addition of a magnetic field applied to the glow discharge. The magnetic field is supplied by the magnetic field coil 34 to provide a magnetic field which is essentially perpendicular to the device surface 25. The purpose of the magnetic field is to increase the ion density of the glow discharge and to confine the discharge to the target area. The magnetic field causes the electrons in the glow discharge to follow a helical path, instead of a straight line to the nearest grounded point; and as a result, increases the path length of the electrons and thereby increases the number of collisions between electrons and atoms of the evaporated metal and the sputtering gas. By increasing the number of evaporated metal atoms which are ionized by the electron collisions, a greater percentage of the evaporated metal is accelerated and implanted in the surface 25; and thereby increases the adherence of the metal and improves the ohmic contacts.

The value of the magnetic field is inversely proportional to the radius of the backing plate 22. The smaller the target, the greater the magnetic field has to be to sufficiently confine the glow discharge and the ionized metal. In the present vacuum system 10, a magnetic field of 25 gauss is used for a backing plate 22 6 inches in diameter, and a magnetic field of 50 gauss is used for a backing plate 22 3 inches in diameter.

EXAMPLE III

This example is also similar to Example I, but particular attention is paid to the type and configuration of the target backing plate 22. The backing plate 22 is made substantially larger than the device 24 so that the backing plate 22 is also sputter-etched by the glow discharge. As a result of this, some of the sputter-etched material from the backing plate is reflected onto the surface 25 by way of collisions with gas atoms in the glow discharge. Thus, additional material is sputter deposited onto the device surface 25 from the backing plate 22. The sputtered material is deposited onto the surface 25 from all angles; and consequently, it helps to uniformly coat the surface 25, including steep edges and areas which are not directly exposed to the filament 28. To obtain the optimum results, the backing plate 22 is made of a material which is compatible with both the metallization and semiconductor materials, as for instance a refractory noble metal. In the preferred embodiment of this invention, the backing plate material can be either palladium, platinum, rhodium iridium, or rhenium; although other metals and some alloys may also be employed, as for instance pure aluminum or an alloy composed of 98 percent aluminum and 2 percent silicon.

The present metallization method has particular utility in large scale integrated circuits which require miltilevel metallization. A number of advantages are obtained by using the present metallization method. First, the bottom metal layer forms a smooth, adherent film making direct ohmic contact to the semiconductor without sintering. Second, an insulating layer may be easily deposited upon the first metal layer. The insulating layer can be made of a reasonable thickness, in the order of about 1 micrometer, without having to worry about hillocks or other projections as large as 5 or 6 micrometers penetrating through the insulating layer or creating high-field points which will later break down. In turn, the insulating layer can easily be etched by standard photoresist techniques to allow for the deposition of subsequent metal layers. Third, additional metal layers may be deposited and form direct ohmic contacts to the bottom metal layer without sintering because the inherent oxide layers on the bottom metal layer are sputter-etched in the same way that the oxide layers are removed from the semiconductor contact openings. Additionally, the characteristics of the bottom layer, as well as top layer, are maintained since none of the layers has to be sintered after it is deposited.

I claim:

1. A process for metallizing the surface of a semiconductor device in a vacuum system comprising:

a. radiofrequency sputter-etching the surface of said device for a period of time sufficient to remove residual oxide layers therefrom while simultaneously sputter-etching a target backing plate in electrical contact with said device so that sputtered material from said backing plate is deposited on said surface of said device, and b. evaporating a quantity of metal onto said oxide-free surface while continuing to sputter-etch said surface.

2. A process for metallizing the surface of a semiconductor device as in claim 1 where said backing plate material is a noble metal.

3. A process for forming ohmic contacts on a surface of semiconductor body of a device comprising:

a. attaching said device in electrical contact with a backing plate comprising a first metal which it is desired to deposit on said surface for said ohmic contacts, and establishing a radiofrequency glow discharge in a vacuum system with said surface of said device and said backing plate being the target of said glow discharge so that said surface and said backing plate are sputter-etched by ion bombardment of said glow discharge to remove impurities from said surface and to deposit said first metal on said surface;

b. evaporating a quantity of a second metal onto said purified surface while maintaining said glow discharge so that said second metal is partially ionized and accelerated towards said surface, thereby forming a solid solution with said first metal and said semiconductor to provide a direct ohmic contact therewith; and c. removing portions of said metal to define electrode leads for said device.

* * * * *